United States Patent
Wang et al.

(10) Patent No.: US 7,335,594 B1
(45) Date of Patent: Feb. 26, 2008

(54) METHOD FOR MANUFACTURING A MEMORY DEVICE HAVING A NANOCRYSTAL CHARGE STORAGE REGION

(75) Inventors: Connie Pin-Chin Wang, Mountain View, CA (US); Zoran Krivokapic, Santa Clara, CA (US); Suzette Keefe Pangrle, Cupertino, CA (US); Jinsong Yin, Sunnyvale, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 363 days.

(21) Appl. No.: 11/116,538

(22) Filed: Apr. 27, 2005

(51) Int. Cl.
*H01L 21/44* (2006.01)

(52) U.S. Cl. ............... 438/677; 257/E21.171; 257/E21.423

(58) Field of Classification Search ........... 438/654, 438/677; 257/E21.171, E21.478, E21.423, 257/E21.635
See application file for complete search history.

(56) References Cited

U.S. PATENT DOCUMENTS

| | | | |
|---|---|---|---|
| 5,852,306 A | 12/1998 | Forbes | 257/315 |
| 5,959,896 A | 9/1999 | Forbes | 365/185.33 |
| 6,060,743 A | 5/2000 | Sugiyama et al. | 257/321 |
| 6,262,129 B1 | 7/2001 | Murray et al. | 516/33 |
| 6,723,606 B2 | 4/2004 | Flagan et al. | 438/264 |
| 6,774,061 B2 | 8/2004 | Coffa et al. | 438/962 |
| 6,780,242 B2 | 8/2004 | Norris | 117/104 |
| 7,220,673 B2 * | 5/2007 | Xi et al. | 438/685 |
| 2002/0061646 A1 | 5/2002 | Kan et al. | 438/660 |
| 2002/0192949 A1 | 12/2002 | Kan et al. | 438/652 |
| 2003/0010987 A1 | 1/2003 | Banin et al. | 257/82 |
| 2003/0025133 A1 | 2/2003 | Brousseau, III | 257/213 |
| 2003/0077863 A1 | 4/2003 | Choi et al. | 438/257 |
| 2004/0002195 A1 | 1/2004 | Brousseau, III | 438/301 |
| 2004/0118698 A1 | 6/2004 | Lu et al. | 205/224 |
| 2004/0130941 A1 | 7/2004 | Kan et al. | 365/177 |
| 2004/0130951 A1 | 7/2004 | Forbes | 365/189.01 |
| 2004/0224505 A1 * | 11/2004 | Nguyen et al. | 438/681 |
| 2005/0014335 A1 | 1/2005 | Goldbach et al. | 438/257 |
| 2005/0208763 A1 * | 9/2005 | Byun | 438/653 |
| 2006/0035393 A1 * | 2/2006 | Chudzik et al. | 438/14 |

(Continued)

OTHER PUBLICATIONS

Zengtao Liu, Chungho Lee, Venkat Narayanan, Gen Pei, and Edwin Chihchuan Kan, Metal Nanocrystal Memories—Part I: Device Design and Fabrication, IEEE Transactions on Electron Devices, vol. 49, No. 9, pp. 1606-1613, Sep. 2002.

(Continued)

*Primary Examiner*—Caridad Everhart
(74) *Attorney, Agent, or Firm*—Farjami & Farjami LLP

(57) ABSTRACT

A method for manufacturing a memory device having a metal nanocrystal charge storage structure. A substrate is provided and a first layer of dielectric material is grown on the substrate. An absorption layer is formed on the first layer of dielectric material. The absorption layer includes a plurality of titanium atoms bonded to the first layer of dielectric material, a nitrogen atom bonded to each titanium atom, and at least one ligand bonded to the nitrogen atom. The at least one ligand is removed from the nitrogen atoms to form nucleation centers. A metal such as tungsten is bonded to the nucleation centers to form metallic islands. A dielectric material is formed on the nucleation centers and annealed to form a nanocrystal layer. A control oxide is formed over the nanocrystal layer and a gate electrode is formed on the control oxide.

19 Claims, 2 Drawing Sheets

U.S. PATENT DOCUMENTS

2006/0038242 A1* 2/2006 Hsu et al. .................. 257/407
2006/0046521 A1* 3/2006 Vaartstra et al. ............ 438/778

OTHER PUBLICATIONS

Zengtao Liu, Chungho Lee, Venkat Narayanan, Gen Pei, and Edwin Chihchuan Kan, Metal Nanocrystal Memories—Part II: Electrical Characteristics, IEEE Transactions on Electron Devices, vol. 49, No. 9, pp. 1614-1622, Sep. 2002.

M. Takata, S. Kondoh, T. Sakaguchi, H. Choi, J-C. Shim, H. Kurino and M. Koyanagi, New Non-Volatile Memory with Extremely High Density Metal Nano-Dots, Technical Digest, 2003 IEEE International Electron Devices Meeting, Washington DC, pp. 553-556.

* cited by examiner

METHOD FOR MANUFACTURING A MEMORY DEVICE HAVING A NANOCRYSTAL CHARGE STORAGE REGION

FIELD OF THE INVENTION

This invention relates, in general, to memory devices and, more particularly, to memory devices having metal nanocrystals in a charge storage region.

BACKGROUND OF THE INVENTION

As semiconductor device manufacturers shrink memory devices such as Flash memories and Dynamic Random Access Memories (DRAM's), the charge storage area in these devices decreases resulting in fewer stored electrons. One technique for increasing the number of stored electrons has been to incorporate nanocrystals in the charge storage region of a memory device. FIG. 1 illustrates a prior art memory device 10 having a layer of nanocrystal material disposed in the charge storage region. What is shown in FIG. 1 is a semiconductor substrate 12 on which a gate structure 14 is formed. Gate structure 14 includes a gate conductor 22 disposed on a dielectric stack comprising a tunnel oxide layer 16, a metal nanocrystal layer 18, and a control oxide layer 20. Source and drain regions 24 and 26, respectively, are formed in the portions of substrate 12 adjacent gate structure 14. Metal nanocrystal layer 18 is formed by depositing a thin metal layer on tunnel oxide layer 16, and annealing the metal at high temperatures to cause the metal to agglomerate. Each metal agglomerate is a nanocrystal. The thin metal layer from which the nanocrystals are formed is typically gold, platinum silicide, silver, or nickel.

A drawback with this procedure is that the agglomeration process is random, thus there is a large variation in the size distribution of the nanocrystals. In addition, the mean size of the nanocrystal is sensitive to the local temperature and metal film thickness, making it difficult to control their size distribution on large diameter semiconductor wafers. Because the threshold voltage ($V_t$) is dependent on the size of the nanocrystals, a large variation in nanocrystal size results in a large variation in the threshold voltage across the semiconductor wafer. Another drawback is that disposing the control oxide layer on the nanocrystals oxidizes them thereby degrading their charge storage capacities. Other drawbacks of using the agglomeration process include the cost and complexity of using metals such as gold, platinum silicide, silver, and nickel to form the thin metal layer and the inability of the control oxide to sufficiently fill the spaces between small dimension nanocrystals.

Accordingly, it would be advantageous to have a method for manufacturing a charge storage structure that allows formation of nanocrystals having a uniform size. It would be of further advantage for the structure and method to be cost and time efficient and compatible with memory device manufacturing processes.

SUMMARY OF THE INVENTION

The present invention satisfies the foregoing need by providing a method for manufacturing a memory device having a metal nanocrystal charge storage region. In accordance with one embodiment, the present invention includes providing a substrate and forming a first layer of dielectric material on the substrate. An absorption layer comprising a first atom having a sacrificial ligand and a second atom having a sacrificial ligand are formed on the first layer of dielectric material. The sacrificial ligands are removed from the first and second atoms. A first metal atom is coupled to the first atom of the absorption layer and a second metal atom is coupled to the second atom of the absorption layer.

In accordance with another embodiment, the present invention comprises a method for manufacturing a memory device having a metal nanocrystal charge storage region in which a substrate having a first layer of dielectric material disposed thereon is provided. A plurality of nucleation centers are formed on the first layer of dielectric material, wherein a first nucleation center is separated from a second nucleation center by a first distance. A metal island is formed from at least one nucleation center of the plurality of nucleation centers.

BRIEF DESCRIPTION OF THE DRAWINGS

The present invention will be better understood from a reading of the following detailed description, taken in conjunction with the accompanying drawing figures, in which like reference numbers designate like elements, and in which.

DETAILED DESCRIPTION

Generally, the present invention comprises a method for manufacturing a memory device having a nanocrystal charge storage region. In accordance with an embodiment of the present invention, precursor molecules bond to a dielectric substrate. The precursor molecules are comprised of a base structure or stem to which a plurality of ligands or constituent groups is bonded. The distance between adjacent base structures is governed by the size of the ligands. For example, when the precursor molecules are derived from tetrakis(dimethylamino)titanium (TDMAT), the base structure comprises a nitrogen atom bonded to a titanium atom and methyl ligands bonded to the nitrogen atom. The combination of the base structure and the methyl groups occupies a finite amount of space over the dielectric substrate and blocks other base structures and their associated methyl groups from occupying that same space. This phenomena is typically referred to as steric hindrance. The methyl groups are then stripped off the base structures and a metal having a higher affinity for the base structures than the dielectric material forms metal islands around the base structures. The metal islands are then embedded in a dielectric material to form a nanocrystal layer.

The size of the ligands is not a limitation of the present invention. For example, when the precursor molecules are derived from tetrakis(diethylamino)titanium (TDEAT), the ligands are ethyl groups which are larger than the methyl ligands. The larger the ligands bonded to a base structure, the fewer the number of base structures that can bond to a given area of dielectric material. Thus, when the ethyl groups are stripped away from the base structure fewer nanocrystals are formed in the nanocrystal layer.

Figure 1:
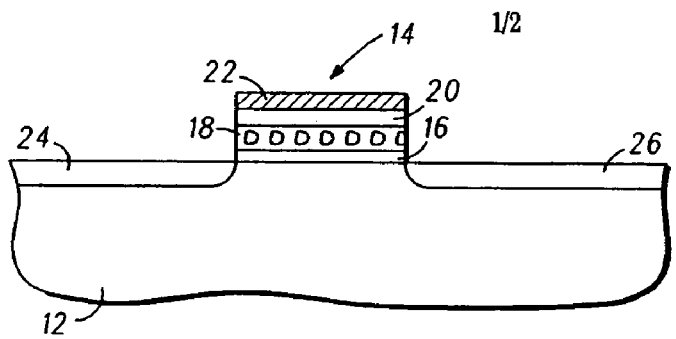
FIG. 1 is a cross-sectional side view of a prior art memory device.
Figure 2:
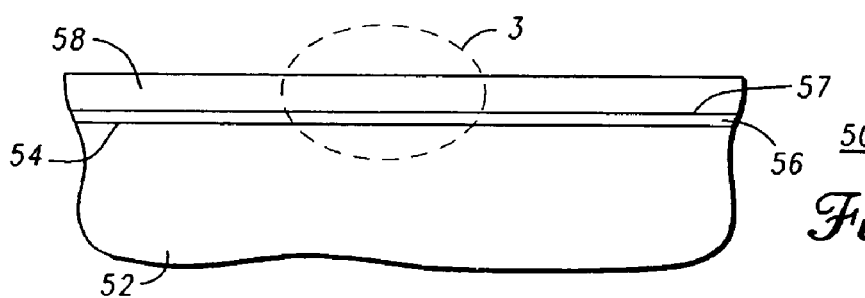
FIG. 2 is cross-sectional side view of a memory device at an early stage of manufacture in accordance with an embodiment of the present invention.

FIG. 2 is an enlarged cross-sectional side view of a portion of a partially completed memory device 50 during processing in accordance with an embodiment of the present invention. What is shown in FIG. 2 is a semiconductor substrate 52 having a major surface 54. Suitable materials for substrate 52 include silicon, germanium, Semiconductor-On-Insulator (SOI), silicon germanium, gallium arsenide, indium phosphide, other compound semiconductor materials, or the like. The semiconductor material may also be a semiconductor substrate having an epitaxial layer formed thereon. A layer of dielectric material 56 having a surface 57 and a thickness ranging from about 20 Angstroms (Å) to about 50 Å is formed on substrate 52. By way of example, layer of dielectric material 56 is oxide grown by dry oxidation. It should be noted that the type of dielectric material for dielectric layer 56 and the technique for forming dielectric layer 56 are not limitations of the present invention.

A metallo-organic layer 58 is formed on oxide layer 56. Metallo-organic layer 58 is also referred to as an absorption layer. In accordance with one embodiment, metallo-organic layer 58 is a titanium nitride layer formed in a chamber using Atomic Layer Deposition (ALD). Suitable precursors for forming titanium nitride layer 58 include tetrakis(dimethylamino)titanium (TDMAT), tetrakis(diethylamino)titanium (TDEAT), Ti(thd)$_4$, Ti(acac)$_4$, or the like. The type of metallo-organic precuror is not a limitation of the present invention. Other suitable metallo-organic precursors include a tantalum nitride precursor, a tungsten nitride precursor, or the like. For example, metallo-organic layer 58 may be comprised of a tantalum nitride film formed using precursors such as pentakis(ethylmethylamido)tantalum (PEMAT), pentakis (diethylamino)tantalum (PDMAT), tungsten hexacarbonyl (W(CO)$_6$)) in an ammonia (NH$_3$) or a hydrogen (H$_2$) plasma for a tungsten nitride process, tertbutylimido (trisdiethylamide) tantalum (TBTDET) in an ammonia (NH$_3$) or a hydrogen (H$_2$) plasma for a tantalum nitride process, or the like.

Figure 3:
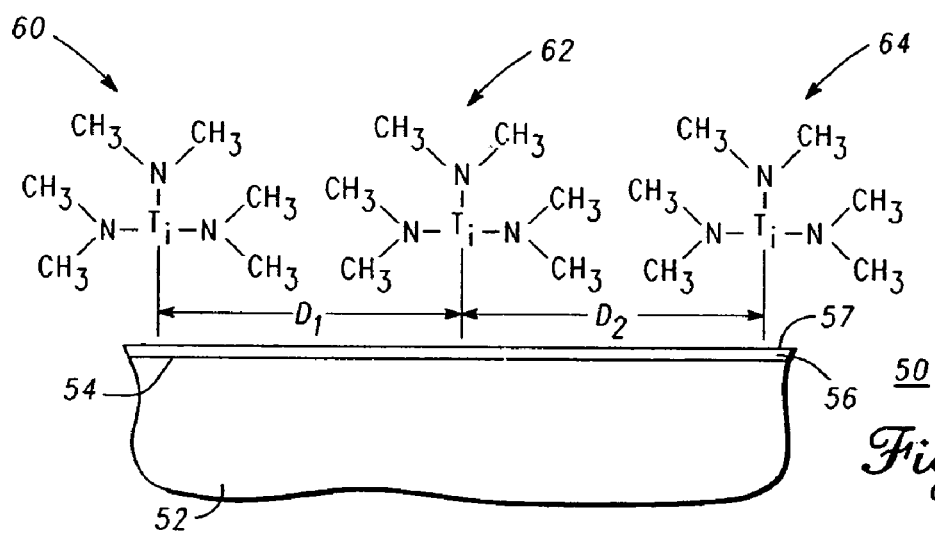
FIG. 3 is an exploded cross-sectional side view of the portion of the memory device within the circularly shaped broken line 3 shown in FIG. 2.

FIG. 3 is an exploded view of the portion of memory device 10 within the circularly shaped broken line 3 shown in FIG. 2. What is shown in FIG. 3 are three tridimethylamine titanate moieties 60, 62, and 64 absorbed onto surface 57. Moieties 60, 62, and 64 each have a metallic portion, i.e., titanium, and an organic portion, i.e., the methyl ligands. Although only three moieties are shown, it should be noted that typically there are more than three moieties absorbed onto a surface like surface 57. In an embodiment in which ALD is used to absorb precursor moieties such as tridimethlyamine titanate moieties 60, 62, and 64 onto surface 57, precursor absorption is self-limited such that a single layer of the precursor is chemically absorbed onto surface 57 after one pulse of precursor flow. Tridimethylamine titanate moieties 60, 62, and 64 repel adjacent moieties from each other. This repulsive effect, commonly referred to as steric hindrance, governs the distance between adjacent moieties. In FIG. 3, the distance between moieties 60 and 62 is labeled as distance $D_1$ and the distance between moieties 62 and 64 is labeled as distance $D_2$. Distances $D_1$ and $D_2$ are typically substantially the same. It should be noted that distances $D_1$ and $D_2$ are dependent on the type of ligand attached to the stem. For example, when the precursor is TDEAT, the moieties include ethyl groups rather than the methyl groups of TDMAT. Because the ethyl groups are larger than the methyl groups, the distances between moieties will be greater for TDEAT than for TDMAT. Fewer moieties can be absorbed onto surface 57 for precursors having large moieties than for precursors having small moieties.

After the single precursor layer is absorbed onto surface 57, excess precursor is purged from the ALD chamber using an inert gas such as, for example, nitrogen, $N_2$, or argon, Ar.

Figure 4:
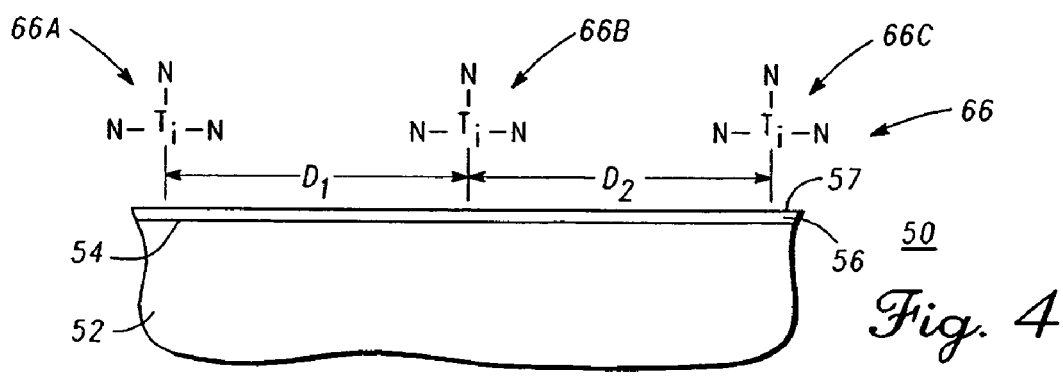
FIG. 4 is a cross-sectional side view of the portion of the memory device of FIG. 3 at a later stage of manufacture.

Referring now to FIG. 4, the methyl ligands are removed from moieties 60, 62, and 64. Because the methyl ligands are removed, they are referred to as sacrificial ligands. In accordance with one embodiment, the methyl ligands are removed using ozone in an oxidation reaction. In accordance with another embodiment, the methyl ligands are removed using nitrogen and hydrogen in a reduction reaction. After removal of the methyl ligands, the remaining portions 66A, 66B, and 66C of moieties, 60, 62, and 64, respectively, serve as nucleation centers. It should be understood that nucleation centers 66A, 66B, and 66C shown in FIG. 4 are only a portion of a plurality of nucleation centers 66 attached to surface 57. As discussed hereinbefore, the spacing or distances between adjacent nucleation centers is primarily governed by the size of the metallo-organic precursor.

Figure 5:
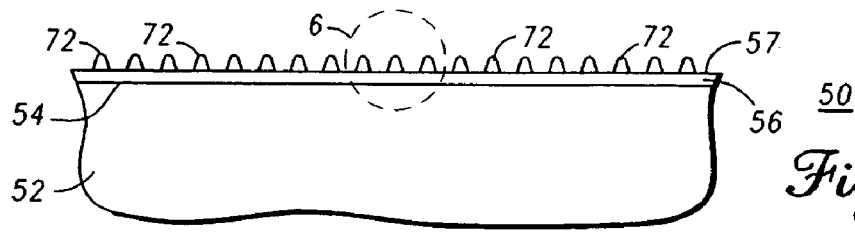
FIG. 5 is a cross-sectional side view of the portion of the memory device of FIG. 4 at a later stage of manufacture.

Referring now to FIG. 5, a plurality of metal islands 72 is formed on nucleation centers 66 preferably using an ALD process or a pulsed Chemical Vapor Deposition (CVD) process. The process for forming the plurality of metal islands 72 is not limited to ALD or CVD. In accordance with one embodiment, gaseous tungsten hexafluoride (WF$_6$) is reacted with gaseous silane (SiH$_4$) in an ALD reaction chamber to form elemental tungsten, which nucleates on nucleation centers 66 to form metal islands 72, i.e., tungsten metal atoms are coupled to titanium atoms of the nucleation centers. Because, the deposition of tungsten is highly selective it forms tungsten islands, i.e., metal islands, on nucleation centers 66 rather than bonding to surface 57 of dielectric layer 56.

Figure 6:
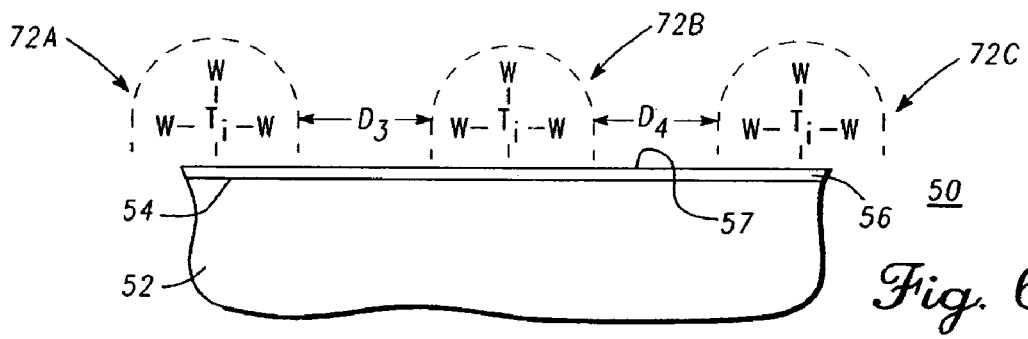
FIG. 6 is an exploded cross-sectional side view of the portion of the memory device within the circularly shaped broken line 6 shown in FIG. 5.

FIG. 6 is an exploded view of the portion of memory device 10 within the circularly shaped broken line 6 shown in FIG. 5. What is shown in FIG. 6 are three metal islands 72A, 72B, and 72C of the plurality of metal islands 72 shown in FIG. 5. Metal islands 72A, 72B, and 72C are formed around nucleation centers 66A, 66B, and 66C, respectively. Metal islands 72A and 72B are separated from each other by a distance $D_3$ and metal islands 72B and 72C are separated from each other by a distance $D_4$.

Metal islands 72 are annealed by heating to a temperature ranging from about 200° C. to about 1,000° C. for a time ranging from about 30 seconds to about 5 minutes. Annealing helps to agglomerate the tungsten of metal islands 72 and further separate metal islands 72 from each other.

Figure 7:
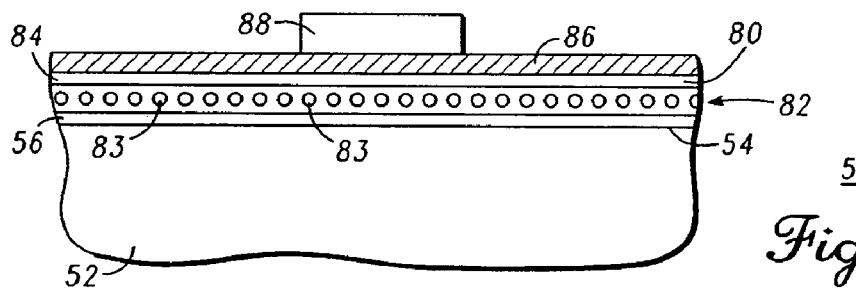
FIG. 7 is a cross-sectional side view of the memory device of FIG. 5 at a later stage of manufacture.

Referring now to FIG. 7, a layer of dielectric material 80 having a thickness ranging from about 10 Å to about 200 Å is formed on metal islands 72 and the exposed portions of surface 57. By way of example, layer of dielectric material 80 is oxide that is deposited using plasma enhanced chemical vapor deposition (PECVD). It should be noted that the type of dielectric material for dielectric layer 80 and the technique for forming dielectric layer 80 are not limitations of the present invention. Metal islands 72 become embedded within dielectric layer 80 and cooperate with dielectric layer 80 to form a nanocrystal layer 82. The embedded metal islands are referred to as nanocrystals 83.

A layer of dielectric material 84 having a thickness ranging from about 70 Å to about 200 Å is disposed nanocrystal layer 82. The thickness of dielectric layer 84 is selected in accordance with its dielectric constant. Thus, if the dielectric material has a low dielectric constant, a thin dielectric layer may be suitable. If the dielectric material has a high dielectric constant, a thicker dielectric material may be more suitable. By way of example, layer of dielectric material 84 is oxide that is deposited using plasma enhanced chemical vapor deposition (PECVD). It should be noted that the type of dielectric material for dielectric layer 84 and the technique for forming dielectric layer 84 are not limitations of the present invention.

A layer of conductive material 86 is formed on dielectric layer 84. In accordance with one embodiment, conductive layer 86 is a metal layer formed using a reactive sputtering method. Suitable metals include metal nitrides such as, for example, tantalum nitride (TaN), titanium nitride (TiN), tungsten nitride (WN), molybdenum nitride (MoN), zirconium nitride (ZrN), hafnium nitride (HfN), or the like. In addition, conductive layer 86 may be comprised of metals having work functions near the valence band. Examples of these types of metals include nickel (Ni), platinum (Pt), ruthenium (Ru), ruthenium oxide ($RuO_2$), or the like. In accordance with another embodiment, conductive layer 86 is a metal layer formed using chemical vapor deposition (CVD) or Atomic Layer Deposition (ALD). Suitable metals for CVD deposition include, but are not limited to, tungsten (W), molybdenum (Mo), tantalum nitride (TaN), tantalum silicon nitride (TaSiN), or the like. In accordance with yet another embodiment, conductive layer 86 is a polysilicon layer such as for example, a p-type doped polysilicon layer. A layer of photoresist is formed on conductive layer 86 and patterned to form an etch mask 88.

Figure 8:
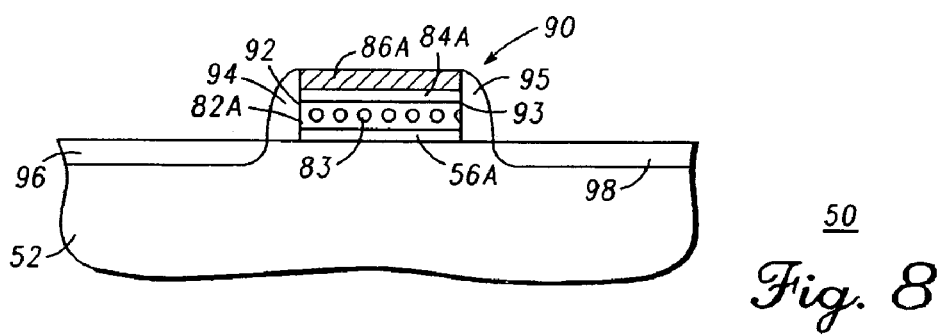
FIG. 8 is a cross-sectional side view of the memory device of FIG. 7 at a later stage of manufacture.

Referring now to FIG. 8, the portions of conductive layer 86, dielectric layer 84, nanocrystal layer 82, and dielectric layer 56 not protected by etch mask 88 are anisotropically etched to form a gate structure 90 having sidewalls 92 and 93. By way of example, layers 86, 84, 82, and 56 are etched using reactive ion etching, wherein substrate 52 serves as an etch stop layer. After the anisotropic etch step, portion 56A of oxide layer 56 remains and serves as a tunnel oxide; portion 82A of nanocrystal layer 82 remains and serves as a metal nanocrystalline charge storage layer; portion 84A of dielectric layer 84 remains and serves as a control oxide; and portion 86A of conductive layer 86 remains and serves as a gate conductor.

Still referring to FIG. 8, sidewall spacers 94 and 95 are formed along sidewalls 92 and 93, respectively. Source and drain regions 96 and 98 are formed in the portions of substrate 52 laterally adjacent spacers 94 and 95, respectively.

By now it should be appreciated that a method for manufacturing a memory device has been provided, wherein the memory device includes a metal nanocrystal charge storage structure. An advantage of the present invention is that the size and distribution of the nanocrystals across the wafer is well controlled, which results in the memory devices having well controlled threshold voltages ($V_t$). The present invention also offers the advantage of using a greater variety of metals to form the nanocrystals. For example, metals like titanium nitride (TiN), tungsten (W), and tantalum nitride (TaN) have a higher melting temperature which is suitable for use in high temperature semiconductor processes. On the other hand, metals like silver, gold, platinum silicide and nickel can be used without suffering the drawbacks encountered in agglomeration processes.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a memory device, comprising:
   providing a substrate;
   forming a first layer of dielectric material on the substrate;
   forming an absorption layer on the first layer of dielectric material, the absorption layer comprising a first atom having a sacrificial ligand and a second atom having a sacrificial ligand;
   removing the sacrificial ligands from the first and second atoms;
   coupling a first metal atom to the first atom of the absorption layer to form a first metal island and coupling a second metal atom to the second atom of the absorption layer to form a second metal island; and
   embedding the first and second metal islands in a second layer of dielectric material.

2. The method of claim 1, wherein forming the absorption layer includes using atomic layer deposition to form the absorption layer.

3. The method of claim 1, wherein coupling the first metal atom to the first atom of the absorption layer and the second metal atom to the second atom of the absorption layer includes reacting tungsten hexafluoride with silane.

4. The method of claim 1, wherein the absorption layer comprises titanium nitride.

5. The method of claim 4, wherein the forming the absorption layer includes using tetrakis(dimethylamino)titanium, (TDMAT) as a precursor material and wherein the absorption layer comprises a plurality of nitrogen atoms wherein two methyl groups are bonded to each nitrogen atom.

6. The method of claim 2, wherein removing the sacrificial ligands from the first and second atoms includes removing at least one of the methyl groups from at least one nitrogen atom.

7. The method of claim 5, wherein removing the sacrificial ligands from the first and second atoms includes removing the two methyl groups from at least one of the nitrogen atom.

8. The method of claim 1, wherein the forming the absorption layer includes using a precursor material comprising titanium.

9. The method of claim 8, wherein the precursor material is one of $Ti(thd)_4$ or $Ti(acac)_4$.

10. A method for manufacturing a memory device, comprising:
    providing a substrate on which a first layer of dielectric material is disposed;
    forming a plurality of nucleation centers on the first layer of dielectric material, wherein a first nucleation center is separated from a second nucleation center by a first distance;
    forming a metal island from at least one nucleation center of the plurality of nucleation centers; and
    embedding the metal island in a second layer of dielectric material.

11. The method of claim 10, wherein forming the metal island from the at least one nucleation center of the plurality of nucleation centers includes forming a plurality of metal islands, wherein each metal island is associated with a corresponding nucleation center.

12. The method of claim 10, wherein forming the plurality of nucleation centers on the first layer of dielectric material includes using steric hindrance to set the first distance.

13. The method of claim 10, wherein forming the plurality of nucleation centers on the first layer of dielectric material includes:
   forming a first precursor molecule on the first layer of dielectric material, the first precursor molecule having a metallic portion and an organic portion;
   forming a second precursor molecule on the first layer of dielectric material, wherein the second precursor molecule has a metallic portion and an organic portion, and wherein the metallic portion of the first precursor molecule and the metallic portion of the second precursor molecule are spaced apart by the first distance;
   removing the organic portion of the first precursor molecule; and
   removing the organic portion of the second precursor molecule, wherein the metallic portion of the first precursor molecule serves as a first nucleation center and the metallic portion of the second precursor molecule serves as a second nucleation center.

14. The method of claim 13, further including deriving the first and second precursor molecules from a metallo-organic precursor selected from a group of metallo-organic precursors comprising tetrakis(dimethylamino)titanium (TDMAT), tetrakis(di ethylamino)titanium (TDEAT), pentakis(ethylmethylamido)tantalum (PEMAT), and pentakis(diethylamino)tantalum (PDMAT).

15. The method of claim 14, wherein forming the plurality of nucleation centers includes using one of atomic layer deposition or chemical vapor deposition.

16. The method of claim 14, wherein forming the metal island on the at least one nucleation center of the plurality of nucleation centers includes forming one of tungsten islands or tantalum islands.

17. The method of claim 16, wherein forming the one of tungsten islands or tantalum islands includes using either atomic layer deposition or chemical vapor deposition.

18. The method of claim 17, further including annealing the metal island.

19. A method for manufacturing a memory device, comprising:
   providing a substrate;
   forming a first layer of dielectric material on the substrate;
   forming an absorption layer on the first layer of dielectric material, the absorption layer comprising a first atom having a sacrificial ligand and a second atom having a sacrificial ligand;
   removing the sacrificial ligands from the first and second atoms; and
   coupling a first metal atom to the first atom of the absorption layer and a second metal atom to the second atom of the absorption layer;
   wherein the forming the absorption layer includes using a precursor material comprising titanium, and wherein the precursor material is one of $Ti(thd)_4$ or $Ti(acac)_4$.

* * * * *